US010910923B2

(12) United States Patent
Adachi et al.

(10) Patent No.: US 10,910,923 B2
(45) Date of Patent: Feb. 2, 2021

(54) ROTATING ELECTRIC MACHINE AND DEFECT DETECTION METHOD FOR ROTATING ELECTRIC MACHINE

(71) Applicant: Mitsubishi Power, Ltd., Yokohama (JP)

(72) Inventors: Hajime Adachi, Yokohama (JP); Keiji Suzuki, Yokohama (JP); Shigeki Tounosu, Yokohama (JP)

(73) Assignee: Mitsubishi Power, Ltd., Yokohama (JP)

( * ) Notice: Subject to any disclaimer, the term of this patent is extended or adjusted under 35 U.S.C. 154(b) by 819 days.

(21) Appl. No.: 15/428,573

(22) Filed: Feb. 9, 2017

(65) Prior Publication Data
US 2017/0250592 A1  Aug. 31, 2017

(30) Foreign Application Priority Data

Feb. 25, 2016 (JP) ................. 2016-033997
Dec. 22, 2016 (JP) ................. 2016-248911

(51) Int. Cl.
*H02K 11/27* (2016.01)
*G01R 31/12* (2020.01)
(Continued)

(52) U.S. Cl.
CPC ......... *H02K 11/27* (2016.01); *G01R 31/1272* (2013.01); *G01R 31/343* (2013.01); *H02K 5/22* (2013.01)

(58) Field of Classification Search
CPC ........... H01F 7/0221; H01F 7/021; H01F 7/02
See application file for complete search history.

(56) References Cited

U.S. PATENT DOCUMENTS 4,261,206 A    4/1981  Futakawa et al.
2010/0162560 A1*  7/2010  Lape .................. H02K 15/0006
                                                29/764
(Continued)

FOREIGN PATENT DOCUMENTS

JP    3-117346 A    5/1991
JP    2000-346916 A    12/2000
(Continued)

OTHER PUBLICATIONS

European Communication pursuant to Article 94(3) EPC issued in counterpart European Application No. 17155665.7 dated Jun. 24, 2019 (three (3) pages).

(Continued)

*Primary Examiner* — Terrance L Kenerly
(74) *Attorney, Agent, or Firm* — Crowell & Moring LLP

(57) ABSTRACT

The present invention provides a rotating electric machine and a method of detecting electric discharge (a defect detection method for a rotating electric machine), which are able to early detect vibration sparking between a stator winding and a stator core. A rotating electric machine of the present invention comprises a cylindrical stator including a stator core and a stator winding, a rotor disposed inside the stator, at least one key bar disposed on an outer periphery of the stator core and extended in an axial direction of the stator, and at least one current detector disposed on the key bar and configured to measure a current flowing in the key bar.

15 Claims, 7 Drawing Sheets

(51) Int. Cl.
    *G01R 31/34*     (2020.01)
    *H02K 5/22*     (2006.01)

(56) References Cited

U.S. PATENT DOCUMENTS

2010/0277199 A1   11/2010   Cusido I Roura et al.
2015/0219692 A1*   8/2015   Krah .................. G01R 15/207
                                                                            324/117 H

FOREIGN PATENT DOCUMENTS

| JP | 2005-274440 A | 10/2005 |
| JP | 2006-138687 A | 6/2006 |
| KR | 10-1035497 B1 | 5/2011 |

OTHER PUBLICATIONS

European Search Report issued in counterpart European Application No. 17155665.7 dated Jul. 31, 2017 (eight pages).
Romary et al., "Offline and Online Methods for Stator Core Fault Detection in Large Generators", IEEE Transactions on Industrial Electronics, Sep. 1, 2013, pp. 4084-4092, vol. 60, No. 9, XP011507082.
Tallam et al., "A Survey of Methods for Detection of Stator-Related Faults in Induction Machines", IEEE Transactions of Industry Applications, Jul. 1, 2007, pp. 920-933, vol. 43, No. 4, XP011187799.
Tavner, "Review of condition monitoring of rotating electrical machines", IET Electr. Power Appl, Jul. 1, 2008, pp. 215-247, vol. 2, No. 4, The Institute of Engineering and Technology, XP006031262.
Liese, "Vibration Sparking, an Ignored Damage Mechanism of High Voltage Windings", Proceedings of the 2008 International Conference on Electrical Machines, 2008, seven pages.
Extended European Search Report issued in European Application No. 17 155 665.7 dated Mar. 6, 2020 (four (4) pages).

\* cited by examiner

ROTATING ELECTRIC MACHINE AND DEFECT DETECTION METHOD FOR ROTATING ELECTRIC MACHINE

CLAIM OF PRIORITY

The present application claims priority from Japanese Patent Applications JP 2016-033997 filed on Feb. 25, 2016 and JP 2016-248911 filed on Dec. 22, 2016, the contents of which are hereby incorporated by reference into this application.

FIELD OF THE INVENTION

The present invention relates to a rotating electric machine, such as a generator or an electric motor, and to a defect detection method for a rotating electric machine.

BACKGROUND OF THE INVENTION

A rotating electric machine includes a stator and a rotor. The stator includes a stator core and a stator winding. The stator core (which hereinafter may be referred to as the "core") is formed of laminated electromagnetic steel plates. The stator winding (which hereinafter may be referred to as the "winding") is formed of a conductor, a main insulation, and a low-resistance corona shield. The winding is embedded and fixed in a slot included in the core.

When an insulation in the slot of the stator is deteriorated, the force to fix the winding is weakened so that the winding vibrates in the slot during an operation of the rotating electric machine. This vibration may cause electric discharge (vibration sparking) between the winding and the core. If vibration sparking occurs between the winding and the core, the main insulation of the winding is seriously damaged. Early detection of vibration sparking is useful as a preventive maintenance technology because it can suppress damage expansion and prevent serious damage to the stator.

Examples of technologies for detecting electric discharge of the stator winding are disclosed in JP 2006-138687, JP 2005-274440, JP 03-117346, and JP 2000-346916. These documents disclose technologies for detecting partial discharge that occurs in the main insulation of the stator winding.

Vibration sparking that occurs between the winding and the core seriously damages the core and the insulation of the winding. Therefore, early detection of the vibration sparking is desirable. The vibration sparking does not occur and cannot be detected in an off-line state where the rotating electric machine is stopped. Thus, the vibration sparking needs to be detected in an on-line state where the rotating electric machine is operating. However, it is difficult to detect the vibration sparking by itself. As described in the above-mentioned documents, there are technologies for detecting partial discharge (electric discharge inside the insulation) that occurs in the main insulation of a winding. Unfortunately, these technologies do not identify and detect the vibration sparking by itself.

Conventionally, the vibration sparking is not found until damage caused by electric discharge is detected during, for example, a periodic inspection on the interior of a rotating electric machine. When the vibration sparking is found in conventional technologies, the damage is often expanded.

SUMMARY OF THE INVENTION

The present invention provides a rotating electric machine and a method of detecting electric discharge (a defect detection method for a rotating electric machine), which are able to early detect vibration sparking between a stator winding and a stator core.

A rotating electric machine of the present invention comprises a cylindrical stator including a stator core and a stator winding, a rotor disposed inside the stator, at least one key bar disposed on an outer periphery of the stator core and extended in an axial direction of the stator, and at least one current detector disposed on the key bar and configured to measure a current flowing in the key bar.

An aspect of the present invention provides a rotating electric machine which is able to early detect vibration sparking between a stator winding and a stator core. Another aspect of the present invention provides a method of detecting electric discharge (a defect detection method for a rotating electric machine) which is able to early detect the vibration sparking.

DETAILED DESCRIPTION OF THE INVENTION

Figure 1:
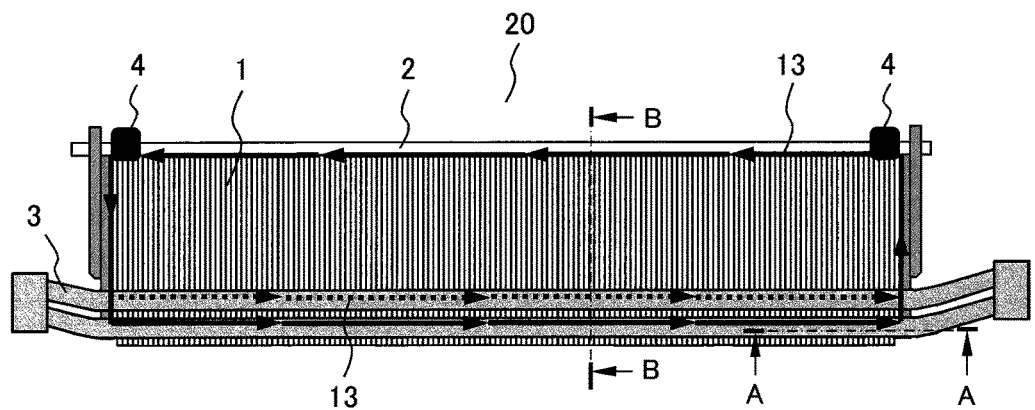
FIG. 1 is a partial cross section of a rotating electric machine according to the first embodiment of the present invention, including the rotation axis of the rotating electric machine and parallel to the rotation axis.

A rotating electric machine according to embodiments of the present invention can be used, for example, for a turbine generator. The following embodiments are described on the assumption that the rotating electric machine according to the embodiments of the present invention is applied to a turbine generator. The same elements in the drawings are designated by the same reference numerals and may not be redundantly described.

Figure 11:
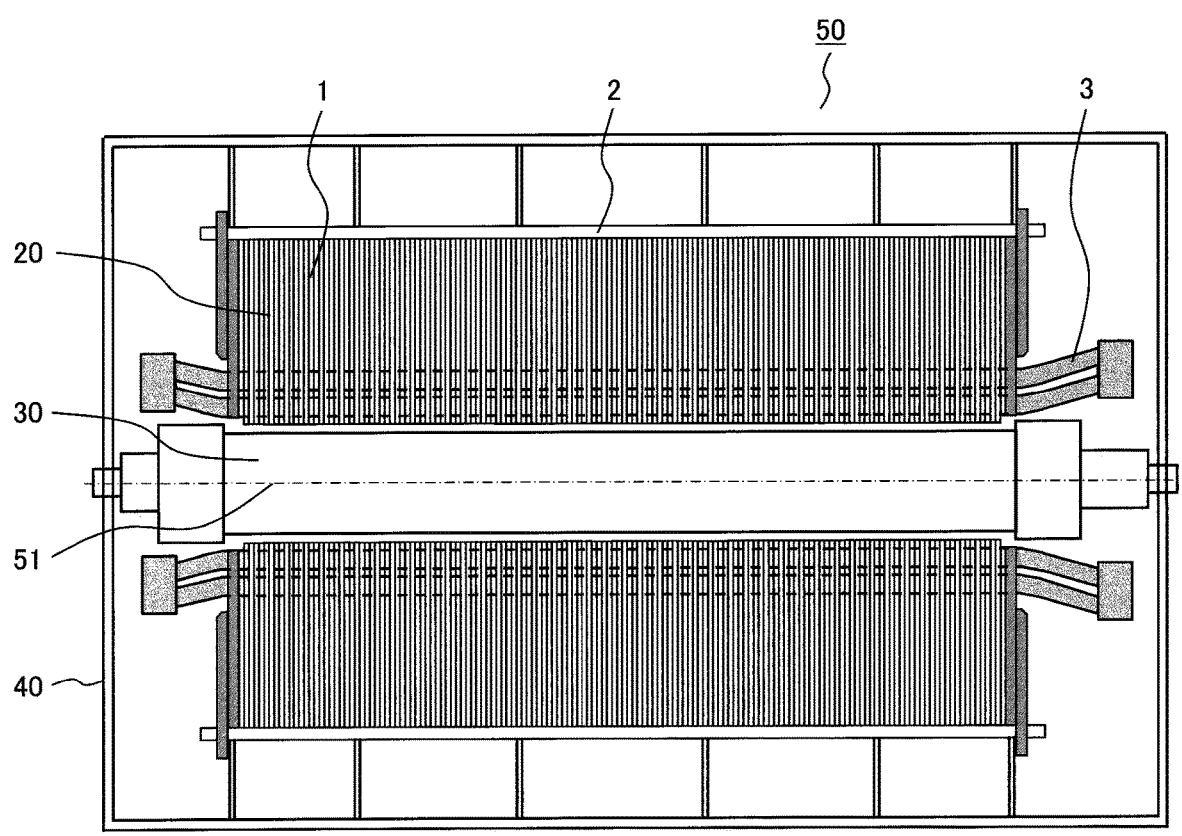
FIG. 11 illustrates an overall configuration of the rotating electric machine.

FIG. 11 illustrates an overall configuration of the rotating electric machine. The rotating electric machine 50 includes a stator 20, a rotor 30, and a rotating electric machine frame 40. The stator 20 has a cylindrical shape. The rotor 30 is disposed inside the stator 20. The rotating electric machine frame 40 accommodates the stator 20 and the rotor 30.

The rotor 30 rotates around a rotation axis 51 while generating a field magnetic flux. The direction of the rotation axis 51 will be hereinafter referred to as the "axial direction". The direction of rotation around the rotation axis 51 will be hereinafter referred to as the "circumferential direction". The direction perpendicular to the axial direction will be hereinafter referred to as the "radial direction". The "axial direction" coincides with the axial direction of the cylindrical stator 20.

The stator 20 includes a stator core 1, at least one key bar 2, and a stator winding 3. The stator core 1 is formed of laminated electromagnetic steel plates. Electromagnetic induction from the stator 20 produces a voltage to cause a current flow. The key bar 2 is a bar-shaped member for fixing the laminated electromagnetic steel plates that form the core 1. One or more key bars 2 are disposed on the outer periphery of the core 1 and extended in the axial direction. The winding 3 is embedded in a slot disposed on the inner periphery of the core 1.

Figure 12:
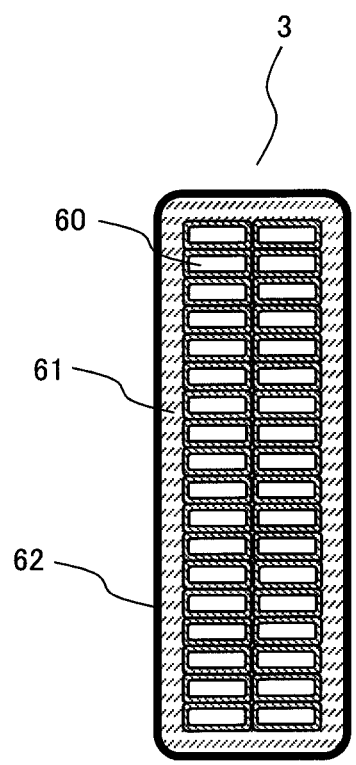
FIG. 12 is a cross-section of a stator winding (illustrating a portion embedded in a slot)

FIG. 12 is a cross-section of the winding 3, illustrating a portion embedded in the slot of the winding 3. The winding 3 mainly includes a conductor 60, a main insulation 61 around the conductor 60, and a low-resistance corona shield 62 on the surface of the winding 3.

While the rotating electric machine 50 operates, a circulating current flows in the key bar 2 and in the low-resistance corona shield 62 on the surface of the winding 3. The circulating current is generated by a magnetic flux (main magnetic flux) that passes through the cross-section of the core 1. When vibration sparking occurs, the value of a current flowing in the key bar 2 changes. The rotating electric machine according to the embodiments of the present invention is configured so that the key bar 2 includes at least one current detector which measures the current flowing in the key bar 2. The rotating electric machine detects the vibration sparking by detecting a change in the waveform of the circulating current caused by occurrence of the vibration sparking.

The rotating electric machine according to the embodiments of the present invention is capable of detecting vibration sparking during an operation of the rotating electric machine and achieving early detection of the vibration sparking. Therefore, the rotating electric machine is able to avoid damage expansion by vibration sparking and prevent serious damage to the stator.

The rotating electric machine according to the embodiments of the present invention will now be specifically described.

First Embodiment

Figure 2:
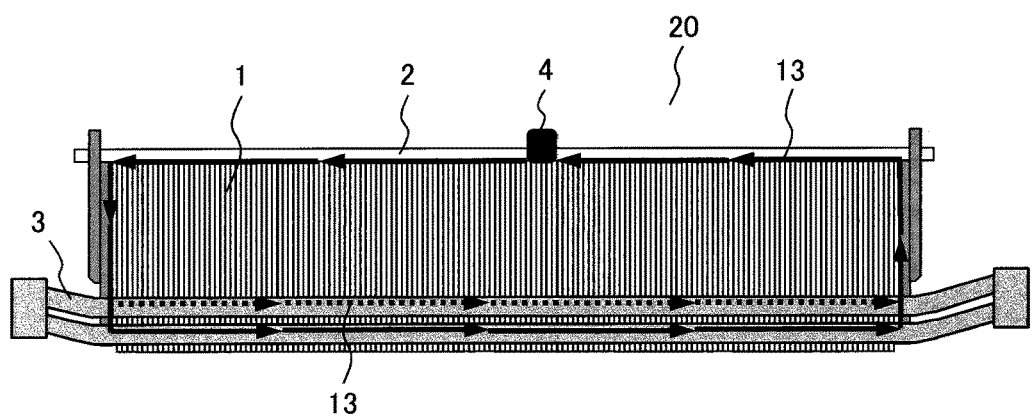
FIG. 2 is a partial cross section of a rotating electric machine according to the first embodiment of the present invention, including the rotation axis of the rotating electric machine and parallel to the rotation axis, and illustrating an arrangement of a current detector.
Figure 3:
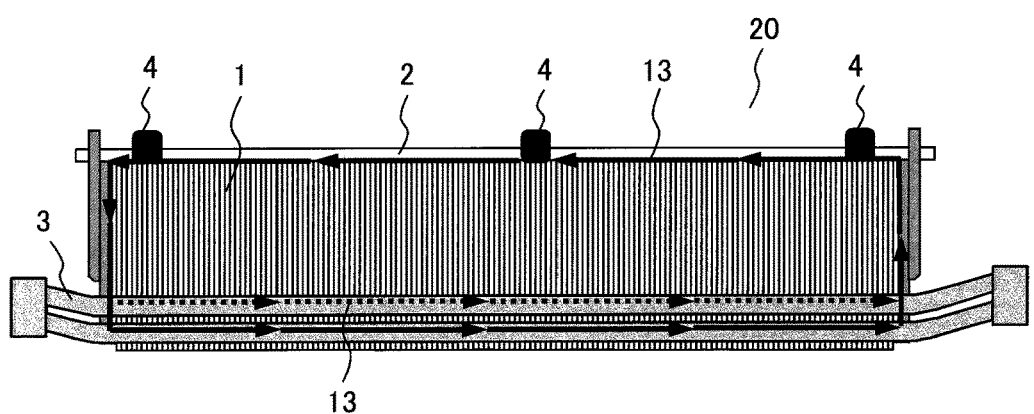
FIG. 3 is a partial cross section of a rotating electric machine according to the first embodiment of the present invention, including the rotation axis of the rotating electric machine and parallel to the rotation axis, and illustrating an alternative arrangement of current detectors.

Each of FIGS. 1, 2, and 3 is a partial cross section of a rotating electric machine according to the first embodiment of the present invention, including the rotation axis 51 of the rotating electric machine and parallel to the rotation axis 51. FIGS. 1 to 3 illustrate only the stator 20 above the rotation axis 51 of the rotating electric machine 50 shown in FIG. 11.

The key bar 2, which fixes the core 1, is provided with the current detector 4. While the rotating electric machine operates, the magnetic flux (main magnetic flux) generated in the core 1 causes the circulating current 13 to flow on the surface of the winding 3 and in the key bar 2. The current detector 4 measures the circulating current 13 flowing in the key bar 2. For example, a Rogowski coil or other current sensor may be used for the current detector 4.

A desired number of at least one current detector 4 may be installed at desired one or more axial positions on the key bar 2. In FIG. 1, two current detectors 4 are disposed at each of the axial ends of the key bar 2. In FIG. 2, one current detector 4 is disposed at the axial center of the key bar 2. In FIG. 3, three current detectors 4 are disposed at both axial ends of the key bar 2 and at the axial center of the key bar 2. Basically, irrespective of the axial position of the current detector 4, the current detector 4 is able to measure a current flowing in the key bar 2 and detect an abnormality, such as vibration sparking or a short circuit between the laminated electromagnetic steel plates of the core. The accuracy of detection of occurrence of the vibration sparking can be improved by increasing the number of the current detectors 4.

Figure 4A:
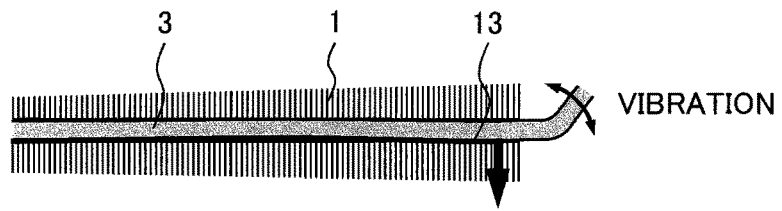
FIG. 4A is a partial cross section taken along line A-A of FIG. 1, illustrating a state where a circulating current is flowing in a core.
Figure 4B:
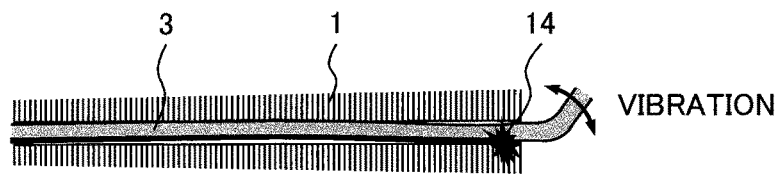
FIG. 4B is a partial cross section taken along line A-A of FIG. 1, illustrating a state where vibration sparking has occurred between a winding and a core.

Each of FIGS. 4A and 4B is a partial cross section (radial cross section) taken along line A-A of FIG. 1, illustrating vibration sparking that occurs when the winding 3 vibrates in the slot of the core 1. FIG. 4A illustrates a state where the winding 3 contacts the core 1 so that the circulating current 13 is flowing in the core 1. FIG. 4B illustrates a state where electric discharge (vibration sparking) 14 has occurred between the winding 3 and the core 1.

When the force of fixing the winding 3 in the slot is weakened, the winding 3 vibrates in the slot so that the winding 3 contacts with and separates from the core 1. When the winding 3 separates from the core 1, electric discharge (vibration sparking) 14 occurs. When the electric discharge 14 occurs, the circulating current 13 becomes slightly disordered (suffers a pulsatile instantaneous change, for example) and comes to have a waveform slightly disordered and varied. The current detector 4 is able to detect occurrence of the vibration sparking during an operation of the rotating electric machine by measuring the circulating current 13 during the operation of the rotating electric machine to detect a change (a pulsatile instantaneous change, for example) in the waveform of the circulating current 13.

Figure 5:
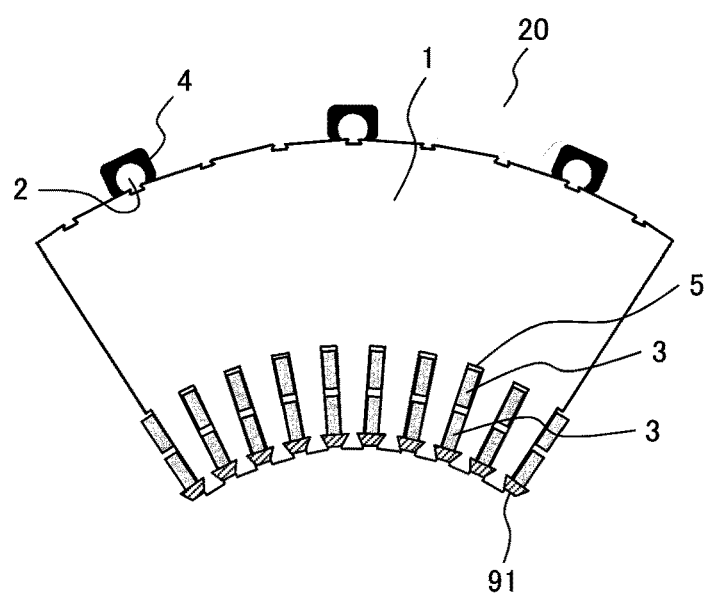
FIG. 5 is a partial cross section (perpendicular to the axial direction) taken along line B-B of FIG. 1.

FIG. 5 is a partial cross section (perpendicular to the axial direction) taken along line B-B of FIG. 1. The winding 3 is embedded in the slot 5 disposed on the inner periphery of the core 1 and fixed by a stator wedge 91. The key bar 2 is positioned on the outer periphery of the core 1. Normally, plural key bars 2 are disposed in the circumferential direction of the stator 20. The current detector 4 is installed on the key bar 2. Therefore, plural current detectors 4 may be installed in the circumferential direction of the core 1. When plural current detectors 4 are installed in the circumferential direction of the core 1, it is possible to identify a circumferential position of the stator 20 where vibration sparking has occurred.

The current detector 4 is installed at a position where the installation is easy. Therefore, the current detector 4 can be installed not only during the manufacture of the rotating electric machine 50 but also after the manufacture.

Second Embodiment

Figure 6:
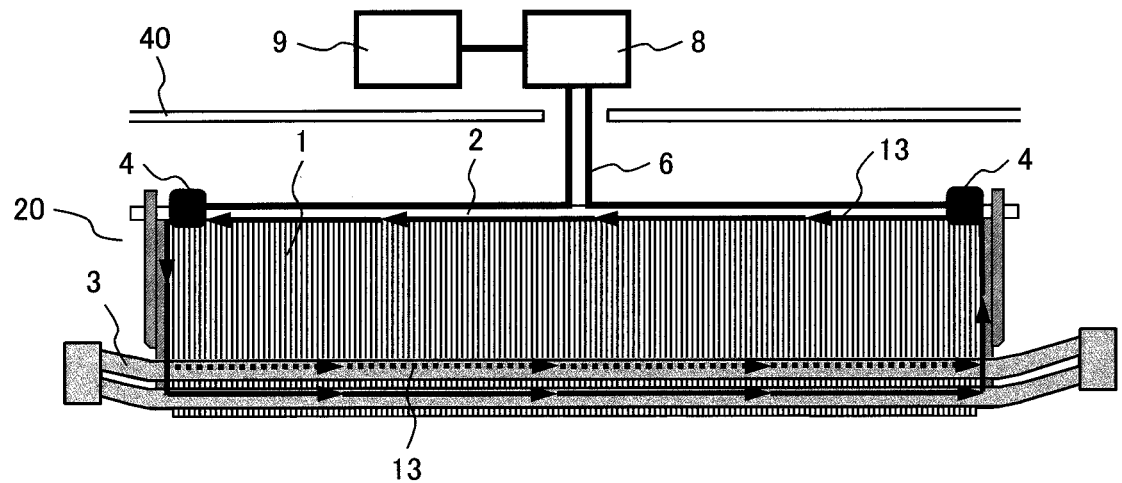
FIG. 6 is a partial cross section of a rotating electric machine according to the second embodiment of the present invention, including the rotation axis of the rotating electric machine and parallel to the rotation axis.

FIG. 6 is a partial cross section of a rotating electric machine according to the second embodiment of the present invention, including the rotation axis 51 of the rotating electric machine and parallel to the rotation axis 51. The rotating electric machine according to the second embodiment further includes a current processor 8 and a monitor 9 in the rotating electric machine according to the first embodiment. The current processor 8 and the monitor 9 are disposed outside the rotating electric machine frame 40. The current processor 8 performs signal processing on data on the current measured by the current detector 4 and may be implemented, for instance, by a computer. The monitor 9 is connected to the current processor 8 and capable of displaying the data on the current measured by the current detector 4 and data processed by the current processor 8. In FIG. 6, two current detectors 4 are disposed at both axial ends of the key bar 2, as in FIG. 1.

The current processor 8 is connected to the current detector 4 through a lead for current detection 6. The current processor 8 reads the value of the circulating current 13 flowing in the key bar 2, which is measured by the current detector 4, and stores data on the read circulating current 13. As a change in the waveform of the circulating current 13, which is caused by occurrence of the vibration sparking 14, is slight (an instantaneous change), the current processor 8 performs signal processing on the data on the circulating current 13, which is measured by the current detector 4, and detects a slight change in the waveform of the circulating current 13 more reliably. For example, the current processor 8 can detect a slight change in the waveform of the circulating current 13, which is caused by occurrence of the vibration sparking 14, by including a filter circuit and performing a frequency filtering process with the filter circuit to derive a high-frequency component of a waveform of the circulating current 13 or by including an amplifier circuit and performing an amplification process on the high-frequency component of the waveform of the circulating current 13 through the use of the amplifier circuit.

The monitor 9 displays at least one of the data on the current measured by the current detector 4, the data on the current processed by the current processor 8, and a slight change in the waveform of the circulating current 13 detected by the current processor 8.

As described above, the rotating electric machine according to the second embodiment is capable of detecting occurrence of the vibration sparking more reliably.

Third Embodiment

Figure 7:
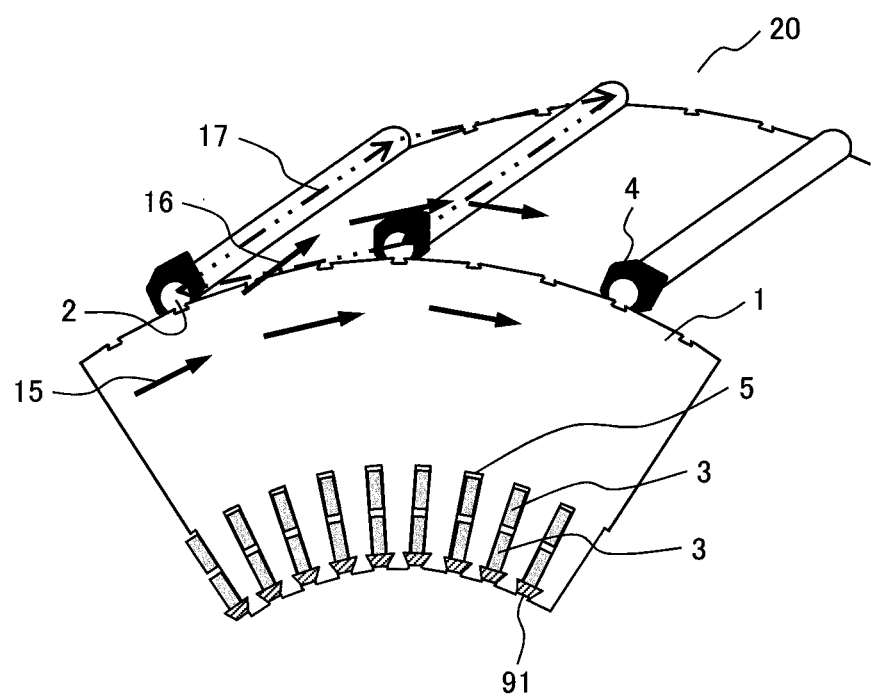
FIG. 7 illustrates a magnetic flux leaking from a stator core.

FIG. 7 illustrates a magnetic flux leaking from the stator core 1. A current 17 (circulating current 13) flowing in the key bar 2 during an operation of the rotating electric machine includes not only the circulating current generated by the main magnetic flux 15 (the current flowing on the surface of the winding 3 and in the key bar 2 as shown in FIG. 1), but also the circulating current generated by a magnetic flux (leakage flux) 16 that leaks from the outer periphery of the core 1. When the stator 20 is over-excited during an operation of the rotating electric machine, the core 1 reaches a state of the magnetic saturation to increase the leakage flux 16, which increases the value of the current 17 that flows in the key bar 2.

The current detector 4 installed on the key bar 2 is capable of detecting an increase in the value of the current 17 flowing in the key bar 2, caused by an over-excitation of the stator 20, from a value obtained during a normal operation. Therefore, the rotating electric machine according to the third embodiment of the present invention is able to achieve early on-line detection of occurrence of the vibration sparking before the expansion of damage to a contact position between the core 1 and the key bar 2 due to an overcurrent and subsequent overheat.

Figure 8:
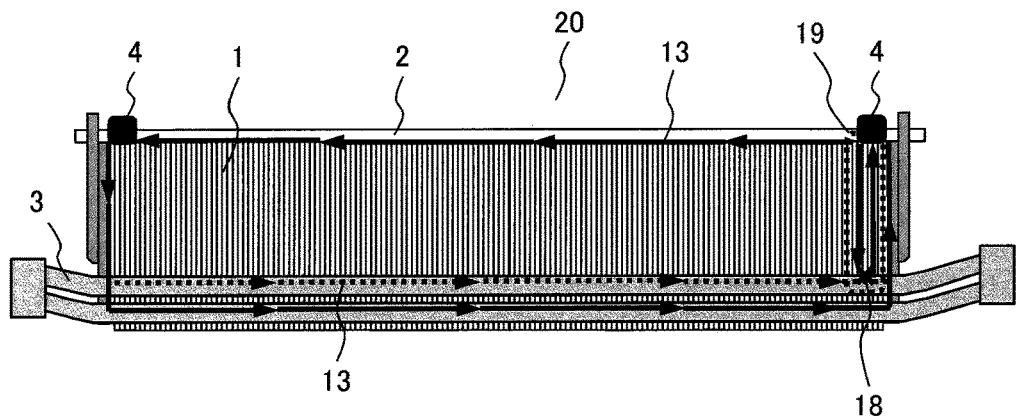
FIG. 8 illustrates a state where laminated electromagnetic steel plates forming the stator core are partly short-circuited.

FIG. 8 illustrates a state where laminated electromagnetic steel plates forming the stator core 1 are partly short-circuited. FIG. 8 shows an example in which a short circuit is formed at a position 18 between the laminated electromagnetic steel plates of the core 1.

The core 1 and the key bar 2 are electrically connected with each other at a position where they are contacts with each other. If a short circuit is formed between the laminated electromagnetic steel plates of the core 1, a current flows in the contact position of the core 1 and the key bar 2 and in the short-circuited position (position 18) between the laminated electromagnetic steel plates of the core 1. Therefore, a large circulating current may flow in these positions 19 to cause overheat, resulting in serious damage to the core 1.

Even when a short circuit is formed between the laminated electromagnetic steel plates of the core 1 as described above, the short circuit can be detected by appropriately selecting the number and locations of the current detectors 4 and by detecting a change in the value of the current flowing in the key bar 2 from the value obtained during a normal operation (detecting an increase or decrease in the current value or a change in the waveform), and also the location of the short circuit can be estimated. Consequently, the rotating electric machine according to the third embodiment is able to prevent damage from growing, which is caused by the short circuit between the laminated electromagnetic steel plates of the core 1.

A change in the current flowing in the key bar 2 is slight (an instantaneous change) when vibration sparking occurs. When the leakage flux 16 is increased or a short circuit is formed between the laminated electromagnetic steel plates of the core 1, the change is greater than when vibration sparking occurs. Therefore, the increase in the leakage flux 16 and the short circuit between the laminated electromagnetic steel plates of the core 1 can be early detected as distinguished from occurrence of vibration sparking.

Fourth Embodiment

Figure 9:
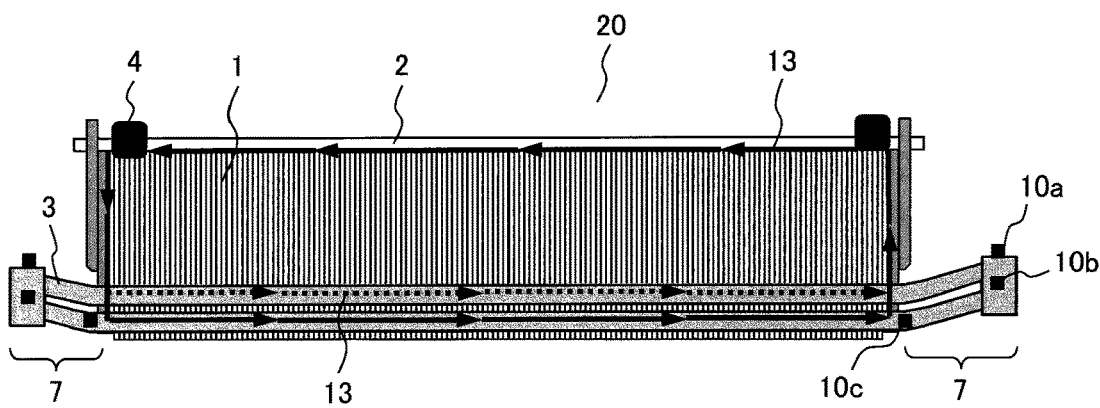
FIG. 9 is a partial cross section of a rotating electric machine according to the fourth embodiment of the present invention, including the rotation axis of the rotating electric machine and parallel to the rotation axis.

FIG. 9 is a partial cross section of a rotating electric machine according to the fourth embodiment of the present invention, including the rotation axis 51 of the rotating electric machine and parallel to the rotation axis 51. The rotating electric machine according to the fourth embodiment includes vibration detectors 10a, 10b, 10c in the end winding 7 of the stator 20. The end winding 7 is a portion of the winding 3, protruding out of the core 1. The vibration detectors 10a-10c are used as an aid for detecting vibration sparking. Examples of the vibration detectors 10a-10c include a vibration meter. The vibration detector 10a detects radial vibration of the winding 3. The vibration detector 10b and the vibration detector 10c detect circumferential vibration of the winding 3.

When the vibration detector 10c, which detects the circumferential vibration, is installed near the axial end of the core 1 as an aid for detecting vibration sparking, changes over time in vibration and the circumferential position of vibration can be confirmed. Thus, the vibration detector 10c is greatly effective for detecting occurrence of vibration sparking and its position. Note that even when the vibration detector 10a, which detects radial vibration, and the vibration detector 10b, which detects circumferential vibration, are installed near the axial end of the end winding 7, changes over time in vibration and its position can be detected.

If abnormality, such as detection by the vibration detectors 10a-10c of greater vibration than vibrations during a normal operation or that of different vibration in behavior from vibrations in the past, is occurred around the same time as occurrence of instantaneous change in the current detected by the current detector 4, the instantaneous change in the current may be caused by vibration sparking. Therefore, detection by the vibration detectors 10a-10c improves the accuracy of detection of vibration sparking. Further, the position of vibration sparking can be estimated from the position of vibration detected by the vibration detectors 10a-10c.

Fifth Embodiment

Figure 10:
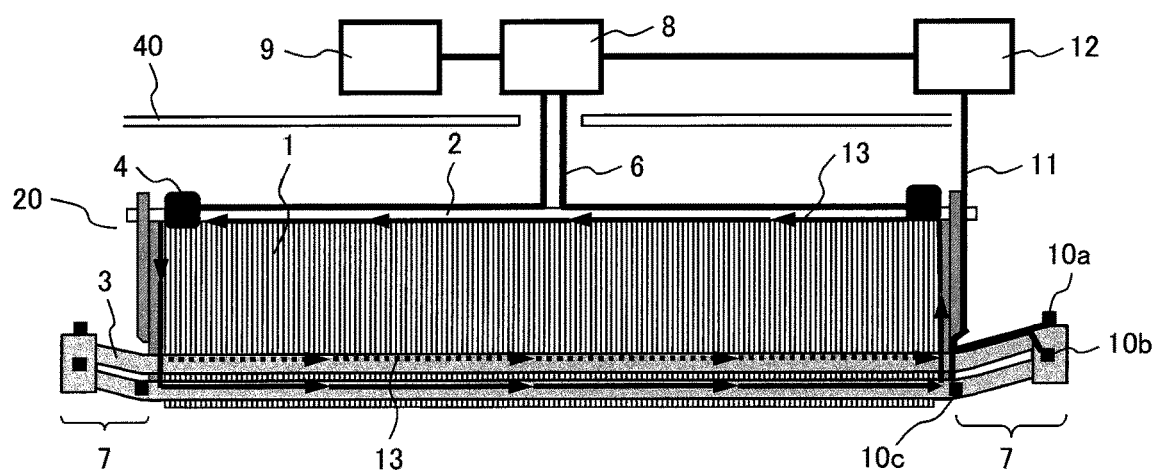
FIG. 10 is a partial cross section of a rotating electric machine according to the fifth embodiment of the present invention, including the rotation axis of the rotating electric machine and parallel to the rotation axis.

FIG. 10 is a partial cross section of a rotating electric machine according to the fifth embodiment of the present invention, including the rotation axis 51 of the rotating electric machine and parallel to the rotation axis 51. The rotating electric machine according to the fifth embodiment further includes the current processor 8, a vibration processor 12, and the monitor 9 in the rotating electric machine according to the fourth embodiment. The current processor 8, the vibration processor 12, and the monitor 9 are installed outside the rotating electric machine frame 40. The current processor 8 processes data on the current detected by the current detector 4. The vibration processor 12 performs signal processing on data on the vibration detected by the vibration detectors 10a-10c. A computer may be used for the current processor 8 and the vibration processor 12, for example. The monitor 9 is connected to the current processor 8 and the vibration processor 12 and displays the current data measured by the current detector 4 and the vibration data detected by the vibration detectors 10a-10c.

The current processor 8 is connected to the current detector 4 through the lead for current detection 6 and reads the value of the circulating current 13 flowing in the key bar 2, which is measured by the current detector 4. The current processor 8 has the same configuration and performs the same process as those described in the second embodiment.

The vibration processor 12 is connected to the vibration detectors 10a-10c through a lead for vibration detection 11 and reads signals of the vibration detected by the vibration detectors 10a-10c. The vibration signals detected by the vibration detectors 10a-10c are used not only for monitoring the vibration of the end winding 7 but also as an aid for detecting vibration sparking. Therefore, the vibration signals are transmitted from the vibration processor 12 to the current processor 8. The current processor 8 stores data on the transmitted vibration signals.

When the vibration detected by the vibration detectors 10a-10c is greater than a vibration during a normal operation, the current processor 8 can confirm that the instantaneous change in the current detected by the current detector 4 is caused by vibration sparking. Further, as described in the first and fourth embodiments, the position where the vibration sparking has occurred can be estimated from the change in the current value detected by the current detector 4 and the vibration detected by the vibration detectors 10a-10c.

The monitor 9 displays at least one of the current data measured by the current detector 4, the current data processed by the current processor 8, the slight change in the waveform of the circulating current 13 detected by the current processor 8, and the vibration data detected by the vibration detectors 10a-10c.

According to the above-described manner, the rotating electric machine of the fifth embodiment is capable of detecting vibration sparking more reliably.

Sixth Embodiment

Figure 13:
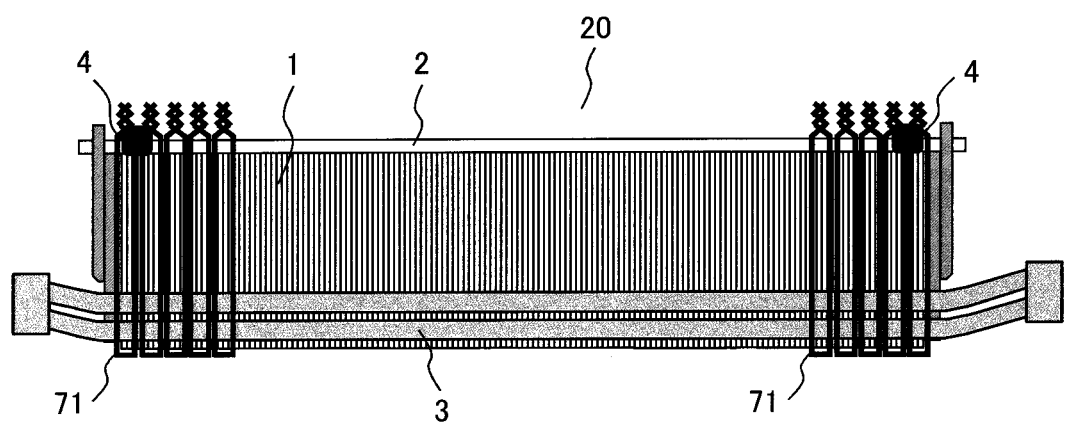
FIG. 13 is a partial cross section of a rotating electric machine according to the sixth embodiment of the present invention, including the rotation axis of the rotating electric machine and parallel to the rotation axis.

FIG. 13 is a partial cross section of a rotating electric machine according to the sixth embodiment of the present invention, including the rotation axis 51 of the rotating electric machine and parallel to the rotation axis 51. The rotating electric machine according to the sixth embodiment includes a magnetic-flux-density detection winding 71 in an axial end region of the stator core 1. The rotating electric machine may include plural magnetic-flux-density detection windings 71 in an axial end region of the stator core 1.

The stator core 1 is formed of laminated electromagnetic steel plates, which are axially divided into plural groups by a ventilation duct for cooling. Each of the groups is called a packet. The magnetic-flux-density detection winding 71 is used as an aid for detecting occurrence of vibration sparking and installed in each packet in the axial end region of the stator core 1, detecting the magnetic flux density of each packet.

The magnetic-flux-density detection winding 71 is preferably installed in the packets in the both axial end regions of the stator core 1. For example, the magnetic-flux-density detection winding 71 is preferably installed in each of several packets (five packets, for example) in the both axial end regions of the stator core 1. The reason is that vibration sparking often occurs at an axial end of the stator core 1. The magnetic-flux-density detection winding 71 can also be used to detect an abnormality in the stator core 1.

If change in the magnetic flux density in the packets detected by the magnetic-flux-density detection winding 71 is occurred around the same time as occurrence of instantaneous change in the current detected by the current detector 4, the instantaneous change in the current may be caused by vibration sparking. Therefore, detection by the magnetic-flux-density detection winding 71 improves the accuracy of detection of vibration sparking.

Occurrence of a short circuit between the laminated electromagnetic steel plates of the stator core 1, caused by vibration sparking for instance, and the position of such a short circuit can be detected by the magnetic-flux-density detection winding 71 by detecting a change in the magnetic flux density in the packets of the stator core 1. Further, an abnormality in the stator 20, such as over-excitement, can also be detected by the magnetic-flux-density detection winding 71.

Seventh Embodiment

Figure 14:
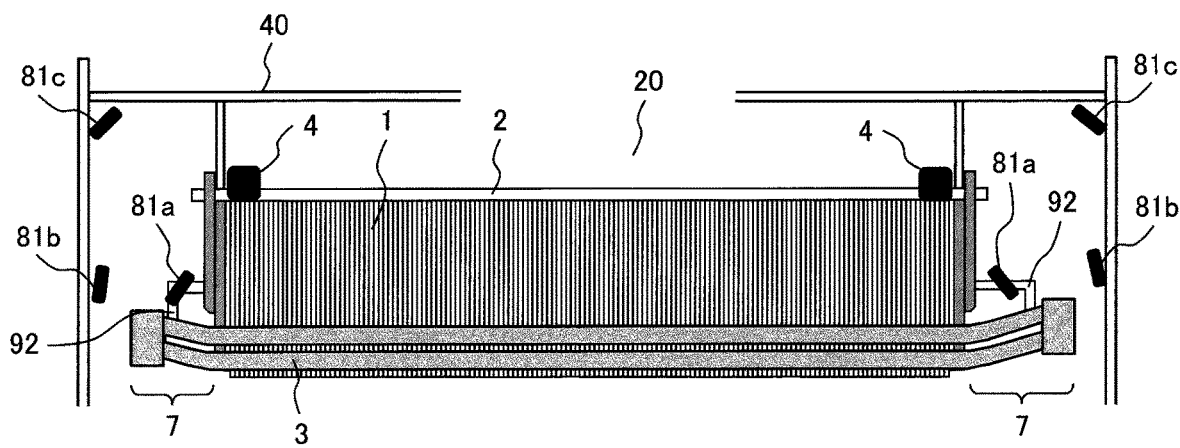
FIG. 14 is a partial cross section of a rotating electric machine according to the seventh embodiment of the present invention, including the rotation axis of the rotating electric machine and parallel to the rotation axis.

FIG. 14 is a partial cross section of a rotating electric machine according to the seventh embodiment of the present invention, including the rotation axis 51 of the rotating electric machine and parallel to the rotation axis 51. The rotating electric machine according to the seventh embodiment includes electric-discharge detectors 81a, 81b, 81c which detect electric discharge from the stator winding 3 at the axial end of the stator core 1. The electric-discharge detectors 81a-81c are devices for detecting electromagnetic wave generated by electric discharge, for example, and existing such devices may be used for the detectors 81a-81c.

The electric-discharge detectors 81a-81c are used as an aid for detecting occurrence of vibration sparking and disposed in a space axially external to the stator core 1. The electric-discharge detectors 81a-81c are preferably disposed around the end winding 7 of the stator 20. For example, the electric-discharge detectors 81a-81c are disposed on either or both of a support member 92 installed in the end winding 7 and the rotating electric machine frame 40. The support member 92 supports the end winding 7. FIG. 14 illustrates an example in which the electric-discharge detector 81a is disposed on the support member 92 and the electric-discharge detectors 81b, 81c are disposed on the rotating electric machine frame 40.

The detection of occurrence of vibration sparking can be assisted by examining the generation of an electric-discharge signal detected by the electric-discharge detectors 81a-81c with respect to utility frequency. If electric discharge from the stator winding 3 detected by the electric-discharge detectors 81a-81c occurs around the same time as occurrence of instantaneous change in the current detected by the current detector 4, the instantaneous change in the current may be caused by vibration sparking. Therefore, detection by the electric-discharge detectors 81a-81c improves the accuracy of detection of vibration sparking. The electric-discharge detectors 81a-81c are also capable of detecting partial discharge occurring in the main insulation of the stator winding 3.

Eighth Embodiment

Figure 15:
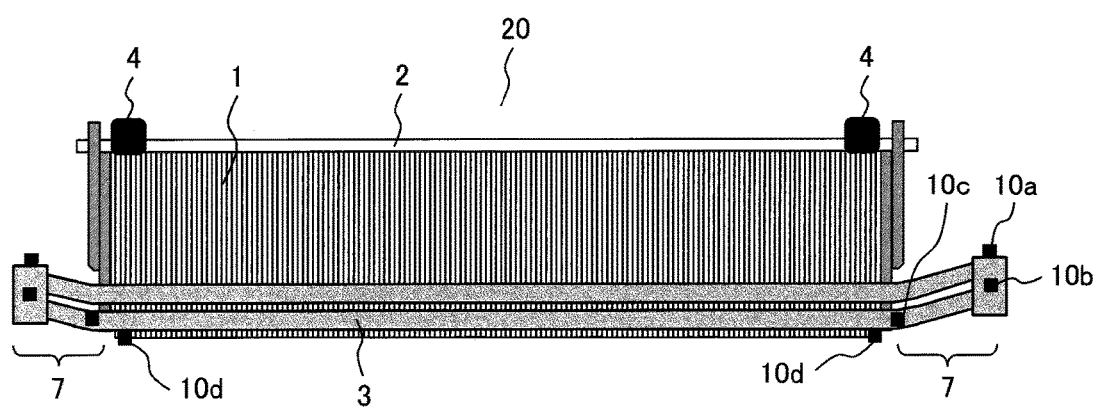
FIG. 15 is a partial cross section of a rotating electric machine according to the eighth embodiment of the present invention, including the rotation axis of the rotating electric machine and parallel to the rotation axis.

FIG. 15 is a partial cross section of a rotating electric machine according to the eighth embodiment of the present invention, including the rotation axis 51 of the rotating electric machine and parallel to the rotation axis 51. The rotating electric machine according to the eighth embodiment includes a vibration detector 10d disposed on the stator wedge 91 (see FIGS. 5 and 7), which fixes the stator winding 3. The vibration detector 10d detects vibration (displacement) of the stator winding 3 at the axial end of the stator core 1. For example, a capacitive vibration sensor may be used for the vibration detector 10d.

The vibration detector 10d is used as an aid for detecting occurrence of vibration sparking. If the vibration (or a change in amplitude) of the stator winding 3 detected by the vibration detector 10d occurs is occurred around the same time as occurrence of instantaneous change in the current detected by the current detector 4, the instantaneous change in the current may be caused by vibration sparking. Therefore, detection by the vibration detector 10d improves the accuracy of detection of vibration sparking. The vibration detector 10d is also able to detect looseness of the fixation of the stator winding 3 at the axial end of the stator core 1.

Further, the rotating electric machine according to the eighth embodiment may include the vibration detectors 10a, 10b, 10c described in the fourth embodiment (FIG. 9). The vibration detectors 10a, 10b, 10c are also useful as an aid for detecting occurrence of vibration sparking.

Ninth Embodiment

Two or more of the configurations of the above-described embodiments may be combined. When the rotating electric machine includes plural measuring devices, the accuracy of detecting occurrence of vibration sparking can be improved. A rotating electric machine according to the ninth embodiment of the present invention includes combination of the configurations of the fourth, sixth, seventh, and eighth embodiments, for example.

Figure 16:
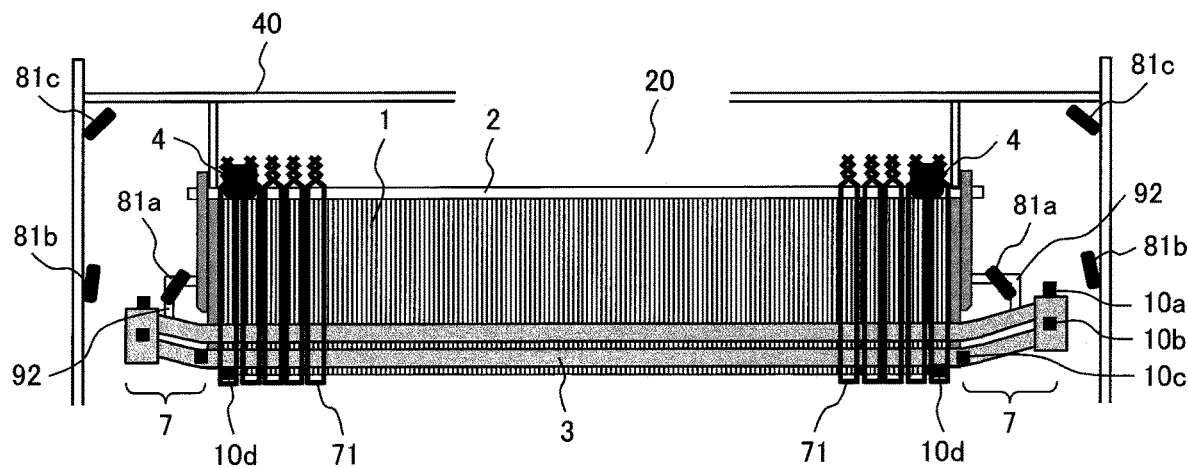
FIG. 16 is a partial cross section of a rotating electric machine according to the ninth embodiment of the present invention, including the rotation axis of the rotating electric machine and parallel to the rotation axis.

FIG. 16 is a partial cross section of a rotating electric machine according to the ninth embodiment of the present invention, including the rotation axis 51 of the rotating electric machine and parallel to the rotation axis 51. The rotating electric machine according to the ninth embodiment includes the magnetic-flux-density detection winding 71 disposed in the axial end region of the stator core 1, the electric-discharge detectors 81a-81c disposed in the space axially external to the stator core 1, the vibration detectors 10a-10c disposed at the end winding 7 of the stator 20, and the vibration detector 10d disposed on the stator wedge 91 (see FIGS. 5 and 7) which fixes the stator winding 3. With including the above measuring devices, the rotating electric machine can further improve the accuracy of detection of occurrence of vibration sparking.

The present invention is not limited to the foregoing embodiments, and the foregoing embodiments may be variously modified. The foregoing embodiments have been described in detail, for example, in order to facilitate the understanding of the present invention. The present invention is not limited to embodiments including all the above-described elements. Some elements of an embodiment may be replaced by the elements of another embodiment. Further, the elements of an embodiment may be added to another embodiment. Furthermore, some elements of each embodiment may be deleted, subjected to the addition of other elements, or replaced by other elements.

EXPLANATION OF REFERENCE CHARACTERS

1 . . . Stator core
2 . . . Key bar
3 . . . Stator winding
4 . . . Current detector
5 . . . Slot
6 . . . Lead for current detection
7 . . . End winding
8 . . . Current processor
9 . . . Monitor
10a, 10b, 10c, 10d . . . Vibration detectors
11 . . . Lead for vibration detection
12 . . . Vibration processor
13 . . . Circulating current
14 . . . Electric discharge (vibration sparking)
15 . . . Main magnetic flux
16 . . . Leakage flux
17 . . . A current flowing in the key bar
18 . . . A position where a short circuit is formed 19 . . . A position where a large circulating current flows
20 . . . Stator
30 . . . Rotor
40 . . . Rotating electric machine frame
50 . . . Rotating electric machine
51 . . . Rotation axis
60 . . . Conductor
61 . . . Main insulation
62 . . . Low-resistance corona shield
71 . . . Magnetic-flux-density detection winding
81a, 81b, 81c . . . electric-discharge detectors
91 . . . Stator wedge
92 . . . Support member

What is claimed is:

1. A rotating electric machine comprising:
a cylindrical stator including a stator core and a stator winding;
a rotor disposed inside the stator;
at least one key bar disposed on an outer periphery of the stator core and extended in an axial direction of the stator;
at least one current detector disposed on the key bar and configured to measure a current flowing in the key bar; and
a current processor configured to perform signal processing on data on the current measured by the at least one current detector; and
a vibration detector disposed on an end winding of the stator winding and configured to detect vibration of the stator winding,
wherein the current processor is configured to determine vibration sparking when an instantaneous change in the current detected by the at least one current detector is detected at a same time as an increase in the vibration is detected by the vibration detector.

2. The rotating electric machine according to claim 1, wherein the at least one current detector comprises a plurality of current detectors.

3. The rotating electric machine according to claim 2, wherein the at least one key bar comprises a plurality of key bars disposed in a circumferential direction of the stator, and
wherein each of the key bars includes at least one of the current detectors.

4. The rotating electric machine according to claim 3, wherein the current detectors are disposed at both axial ends of the key bars.

5. The rotating electric machine according to claim 3, wherein one of the current detectors is disposed in the axial direction on the key bars.

6. The rotating electric machine according to claim 3, wherein the current detectors are disposed in the axial direction on the key bars.

7. The rotating electric machine according to claim 2, wherein the current detectors are disposed at both axial ends of the at least one key bar.

8. The rotating electric machine according to claim 2, wherein the current detectors are disposed in the axial direction on the at least one key bar.

9. The rotating electric machine according to claim 1, wherein one of the at least one current detector is disposed in the axial direction on the at least one key bar.

10. The rotating electric machine according to claim 1, further comprising:
a monitor configured to display at least one of the data on the current measured by the at least one current detector and the data on the current on which the current processor performed the signal processing.

11. The rotating electric machine according to claim 1, wherein the current processor is configured to store the data on the current measured by the at least one current detector and data on the vibration of the stator winding detected by the vibration detector.

12. The rotating electric machine according to claim 1, further comprising:
a magnetic-flux-density detection winding disposed in an axial end region of the stator core and configured to detect magnetic flux density of the stator core.

13. The rotating electric machine according to claim 1, further comprising:
an electric-discharge detector disposed in a space axially external to the stator core and configured to detect electric discharge from the stator winding.

14. The rotating electric machine according to claim 1, further comprising:
a stator wedge configured to fix the stator winding; and
a vibration detector disposed on the stator wedge and configured to detect vibration of the stator winding.

15. A defect detection method for a rotating electric machine, comprising the steps of:
measuring a current with a current detector during an operation of the rotating electric machine, the current flowing in a key bar of the rotating electric machine, the rotating electric machine comprising a cylindrical stator including a stator core and a stator winding, the key bar disposed on an outer periphery of the stator core and extended in an axial direction of the stator, and the current detector disposed on the key bar, and a vibration detector disposed on an end winding of the stator winding and configured to detect vibration of the stator winding;
detecting a change in a waveform of the current during the operation of the rotating electric machine; and
determining vibration sparking when an instantaneous change in the current detected by the current detector is detected at a same time as an increase in the vibration is detected by the vibration detector.

* * * * *